(12) United States Patent
Tedja et al.

(10) Patent No.: US 8,832,634 B2
(45) Date of Patent: Sep. 9, 2014

(54) INTEGRATED CIRCUIT CHARACTERIZATION BASED ON MEASURED AND STATIC APPARENT RESISTANCES

(75) Inventors: Suharli Tedja, San Ramon, CA (US); Swarupchandra Kamerkar, Pune (IN); Vineet Sreekumar, Mumbai (IN); Yadvinder Singh, Jind (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/603,972

(22) Filed: Sep. 5, 2012

(65) Prior Publication Data

US 2014/0068532 A1 Mar. 6, 2014

(51) Int. Cl.
*G06F 17/50* (2006.01)

(52) U.S. Cl.
USPC .......................................................... 716/136

(58) Field of Classification Search
USPC .................................................. 716/100, 136
See application file for complete search history.

(56) References Cited

U.S. PATENT DOCUMENTS

| | | | | |
|---|---|---|---|---|
| 4,620,062 | A * | 10/1986 | Mizzi et al. | 178/18.05 |
| 6,509,739 | B1 * | 1/2003 | Voogel et al. | 324/525 |
| 6,912,437 | B2 * | 6/2005 | Chong et al. | 700/121 |
| 7,882,464 | B1 | 2/2011 | Rochel et al. | |
| 8,611,131 | B2 * | 12/2013 | Chang et al. | 365/148 |
| 8,773,888 | B2 * | 7/2014 | Chang et al. | 365/148 |
| 2002/0175694 | A1 * | 11/2002 | Gamache et al. | 324/760 |
| 2003/0160623 | A1 * | 8/2003 | Tanaka et al. | 324/719 |
| 2003/0212973 | A1 | 11/2003 | Lin et al. | |
| 2008/0186001 | A1 | 8/2008 | Singh et al. | |
| 2011/0260747 | A1 * | 10/2011 | Kameda et al. | 324/762.01 |
| 2012/0038452 | A1 * | 2/2012 | Phlippoteau et al. | 340/3.1 |
| 2012/0126781 | A1 | 5/2012 | Narayanan et al. | |
| 2012/0230080 | A1 * | 9/2012 | Chang et al. | 365/148 |
| 2013/0051125 | A1 * | 2/2013 | Chang et al. | 365/148 |

FOREIGN PATENT DOCUMENTS

| | | |
|---|---|---|
| JP | 2004178501 A | 6/2004 |
| KR | 20030078462 A | 10/2003 |

OTHER PUBLICATIONS

Gregory Steele et al., "Full-Chip Verification Methods for DSM Power Distribution Systems," ACM 35th Design Automation Conference (DAC), Jun. 1998, pp. 744-749.

Tianhan Wang et al., "Multi-Site On-Chip Current Sensor for Electromigration Monitoring," IEEE 54th International Midwest Symposium on Circuits and Systems (MWSCAS), Aug. 2011, pp. 1-4.

(Continued)

*Primary Examiner* — Suchin Parihar
(74) *Attorney, Agent, or Firm* — Ryan, Mason & Lewis, LLP

(57) ABSTRACT

First and second apparent resistance measures are determined for an integrated circuit and utilized to characterize the integrated circuit. The first apparent resistance measure is determined for the integrated circuit based on a first voltage drop and a first current that are measured using test equipment. The second apparent resistance measure is determined for the integrated circuit based on a second voltage drop and a second current that are obtained using static analysis of a corresponding integrated circuit design. The integrated circuit is characterized based on a comparison of the first and second apparent resistance measures. For example, characterizing the integrated circuit may comprise validating the static analysis of the integrated circuit design based on the comparison of the first and second apparent resistance measures, or determining a quality measure of the integrated circuit based on the comparison of the first and second apparent resistance measures.

24 Claims, 2 Drawing Sheets

(56) References Cited

OTHER PUBLICATIONS

Tung-Yeh Wu, "An Area Efficient On-Chip Static IR Drop Detector/Evaluator," IEEE International Symposium on Circuits and Systems (ISCAS), May 2009, pp. 2009-2012.

S. Chakravarty et al., "Optimal Manufacturing Flow to Determine Minimum Operating Voltage," IEEE International Test Conference (ITC), Sep. 2011, pp. 1-10.

Zahi Abuhamdeh, "Characterize Predicted vs Actual IR Drop in a Chip Using Scan Clocks," IEEE International Test Conference (ITC), Oct. 2006, pp. 1-8.

Zahi Abuhamdeh, "A Production IR-Drop Screen on a Chip," IEEE Design & Test of Computers, May-Jun. 2007, pp. 216-224, vol. 24, No. 3.

N. Parris et al., "A Simple Approach to Diagnose Localized Thermal and IR Drop Effects on a Microprocessor Core Using On-Chip Synthesizable Ring Oscillators," IEEE Silicon Debug & Diagnosis Workshop, 2004, 8 pages.

Mingjing Chen et al., "Cost-Effective IR-Drop Failure Identification and Yield Recovery Through a Failure-Adaptive Test Scheme," Design, Automation & Test in Europe (DATE), Mar. 2010, pp. 63-68.

Jayashree Saxena et al., "A Case Study of IR-Drop in Structured At-Speed Testing," IEEE International Test Conference (ITC), Paper 42.2, Sep.-Oct. 2003, pp. 1098-1104, vol. 1.

\* cited by examiner

INTEGRATED CIRCUIT CHARACTERIZATION BASED ON MEASURED AND STATIC APPARENT RESISTANCES

BACKGROUND

An integrated circuit typically includes an internal power grid for distributing power to its various internal cores or other internal subsystems and components. During testing of the integrated circuit, the power grid may be analyzed under various parameter settings and other expected operating conditions in order to ensure that sufficient voltage is provided for the integrated circuit to function properly over all of those operating conditions. This process often involves utilization of so-called IR drop analysis techniques implemented using automated test equipment. For example, these techniques may be used to determine voltage drop of a primary supply voltage such as $V_{dd}$ for particular operating speeds of the integrated circuit. The IR drop analysis in this example may involve repeating the measurements not only over the multiple operating speeds, but also over other operating conditions, such as at different temperatures and supply voltage levels.

A significant drawback of conventional practice is that results of the above-described IR drop analysis based on measurements from automated test equipment are not readily predictable or otherwise verifiable using integrated circuit design software. This can in some cases be attributable to the particular arrangement of automated test equipment that is being used to collect the IR drop measurements, and in other cases may be due to inaccuracies in the integrated circuit design software.

In any event, this inability to correlate actual IR drop measurements with predicted design values can contribute to undesirable situations in which integrated circuits have power grids that are over-designed for the expected operating conditions, possibly leading to excessive manufacturing costs, or alternatively have power grids that provide insufficient design margin over the operating conditions.

The above-described conventional approaches become even more problematic as device dimensions continue to shrink with advances in integrated circuit process technologies. This is because such shrinking device dimensions tend to coincide with increasingly larger power densities, lower supply voltages and higher operating speeds in the corresponding integrated circuits, thereby further complicating design verification.

SUMMARY

Illustrative embodiments of the invention are configured to validate or otherwise characterize an integrated circuit utilizing multiple apparent resistances or other types of apparent resistance measures. For example, such arrangements can be configured to provide more accurate and efficient validation of a particular integrated circuit design by allowing comparison of a measured apparent resistance obtained from an actual physical implementation of the integrated circuit via automated test equipment, or other types of test equipment, with a static apparent resistance obtained from static analysis of the corresponding integrated circuit design.

In one embodiment, first and second apparent resistance measures are determined for an integrated circuit and utilized to characterize the integrated circuit. The first apparent resistance measure is determined for the integrated circuit based on a first voltage drop and a first current that are measured using test equipment. The second apparent resistance measure is determined for the integrated circuit based on a second voltage drop and a second current that are obtained using static analysis of a corresponding integrated circuit design. The integrated circuit is characterized based on a comparison of the first and second apparent resistance measures. By way of example, characterizing the integrated circuit may comprise validating the static analysis of the integrated circuit design based on the comparison of the first and second apparent resistance measures, or determining a quality measure of the integrated circuit based on the comparison of the first and second apparent resistance measures.

A particular value of the second apparent resistance measure may be pre-computed based on the static analysis of the integrated circuit design, and stored in a memory of a processing system. The pre-computed value of the second apparent resistance measure can then be retrieved from the memory as needed and utilized for comparison with each of multiple values of the first apparent resistance measure determined for respective integrated circuits manufactured in accordance with the integrated circuit design.

The illustrative embodiments provide significant advantages relative to conventional practice. For example, one or more of these embodiments allow a measured apparent resistance determined using test equipment to be directly correlated with a static apparent resistance determined using design software, thereby facilitating integrated circuit design verification, while avoiding undesirable situations in which integrated circuits have power grids that are not well matched to their expected operating conditions. Moreover, this apparent resistance based approach scales well with shrinking device dimensions, and can therefore accommodate integrated circuits with large power densities, low supply voltages and high operating speeds. Other types of apparent resistance measures, such as apparent conductances, may be used in embodiments of the invention.

DETAILED DESCRIPTION

Embodiments of the invention will be illustrated herein in conjunction with exemplary processing systems and corresponding integrated circuits that are validated or otherwise characterized using multiple apparent resistances. It should be understood, however, that embodiments of the invention are more generally applicable to any processing system or associated integrated circuit in which it is desirable to provide an enhanced ability to characterize an integrated circuit based at least in part on a combination of measured and static apparent resistances, or other types of apparent resistance measures.

It is to be appreciated that the term "apparent resistance measure" as used herein is intended to be broadly construed so as to encompass an apparent resistance, an apparent conductance, or other type of measure indicative of resistance. Although the embodiments to be described are based on apparent resistances, those skilled in the art will readily recognize that apparent conductances or other types of apparent resistance measures may be used in other embodiments.

Figure 1:
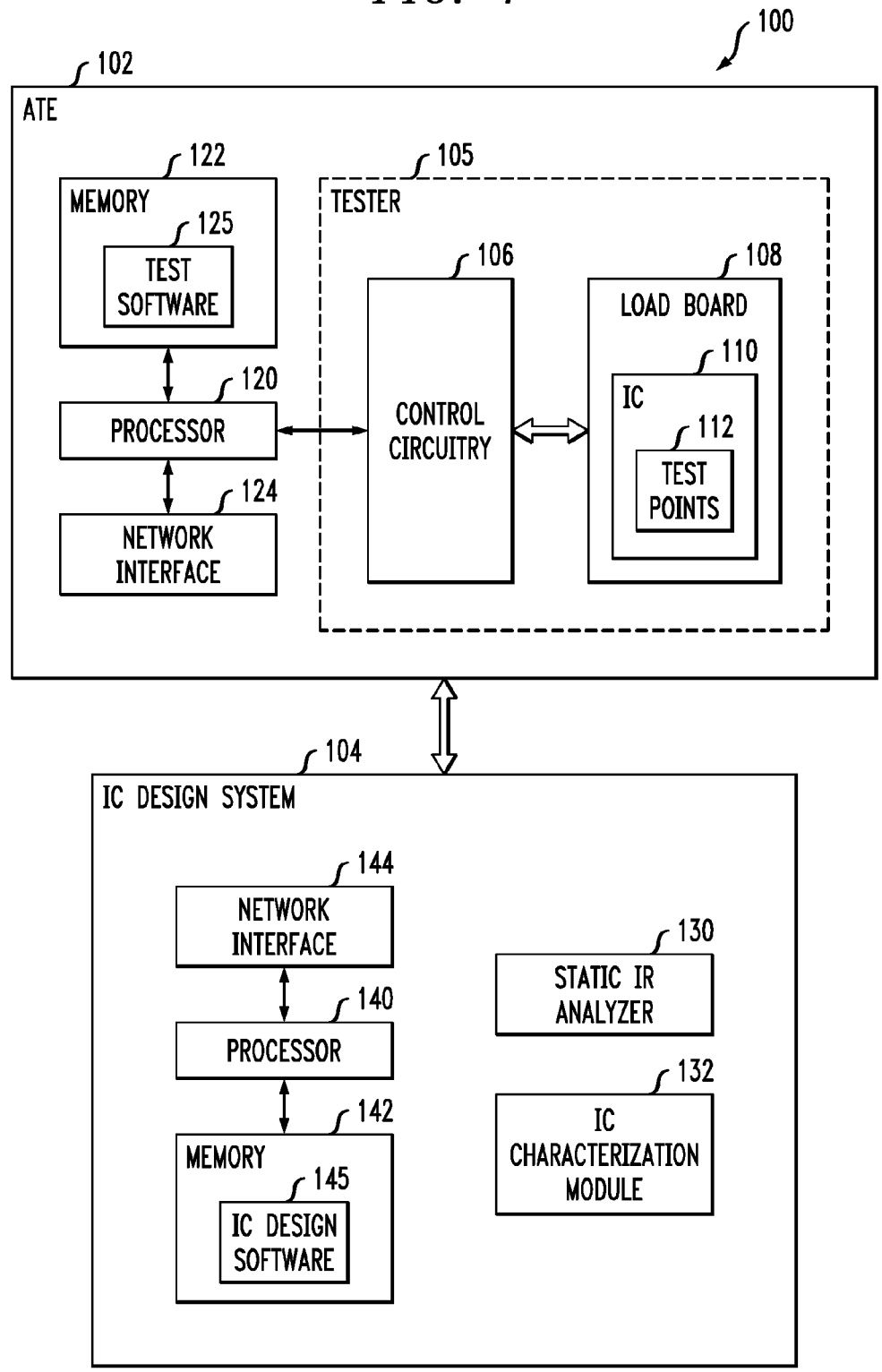
FIG. 1 is a block diagram of a processing system configured for characterizing an integrated circuit based on measured and static apparent resistances in an illustrative embodiment.

FIG. 1 shows an embodiment of the invention in which a processing system 100 comprises automated test equipment (ATE) 102 configured to communicate with an integrated circuit (IC) design system 104. The ATE 102 comprises a tester 105 that includes control circuitry 106 coupled to a load board 108. An integrated circuit under test 110 is installed on the load board 108 and includes one or more embedded test points 112 that are utilized in determining a measured apparent resistance for the integrated circuit 110. More particularly, the measured apparent resistance is determined for the integrated circuit 110 based on a first voltage drop and a first current that are measured using the ATE 102.

An exemplary process for determining the measured apparent resistance using ATE 102 will be described in greater detail in conjunction with blocks 204 and 206 of the FIG. 2 flow diagram. The ATE 102 may be viewed as an example of what is more generally referred to herein as "test equipment." Such test equipment in other embodiments need not be automated, as will be appreciated by those skilled in the art.

The control circuitry 106 may comprise, for example, a test pattern generator for applying particular test signals to the integrated circuit 110. Numerous alternative testers may be used to determine a measured apparent resistance of an integrated circuit as disclosed herein. For example, in other embodiments, one or more portions of an external tester such as tester 105 may instead be incorporated into the integrated circuit 110 itself, using what is commonly referred to as a built-in self-test (BIST) arrangement. Thus, by way of example, BIST circuitry of an integrated circuit may be configured to measure an apparent resistance as disclosed herein and report it to other portions of ATE 102 or directly to the design system 104. Such BIST circuitry may be considered to be part of the ATE as the latter term is intended to be broadly construed herein.

The integrated circuit 110 subject to testing by the ATE 102 may comprise any type of integrated circuit, including, for example, a system-on-chip (SOC) integrated circuit. As one particular illustration, a given SOC integrated circuit may be configured for use in a hard disk drive (HDD) controller application, designed for reading and writing data from one or more magnetic storage disks of an HDD, although SOCs are also used in a wide variety of other applications. An HDD or other storage device comprising an SOC integrated circuit may be considered a type of processing device as that term is used herein.

The ATE 102 in the present embodiment further comprises a processor 120 coupled to a memory 122. Also coupled to the processor 120 is a network interface 124 for permitting the ATE to communicate with the integrated circuit design system 104 or other systems and devices over one or more networks. The network interface 124 may therefore comprise one or more transceivers. The processor 120 interacts with the control circuitry 106 of the tester 105 to control the performance of one or more tests on the integrated circuit 110 in accordance with test software 125 stored in the memory 122, including determination of the measured apparent resistance using one or more embedded test points 112 as mentioned previously.

The integrated circuit design system 104 comprises a static IR analyzer 130 configured to perform static IR analysis on a corresponding design of the integrated circuit 110. The static IR analyzer 130 may be viewed as an example of what is more generally referred to herein as a "static analyzer." Thus, it is to be appreciated that "static analysis" as described herein is not limited to static IR analysis. Moreover, the integrated circuit design system 104 in its entirety may be considered a type of static analyzer as that term is broadly utilized herein. In the present embodiment, the analyzer 130 is configured to determine a static apparent resistance for the integrated circuit 110 based on a second voltage drop and a second current that are obtained using static analysis of a corresponding integrated circuit design.

An exemplary process for determining the static apparent resistance using static IR analyzer 130 will be described in greater detail in conjunction with blocks 208 and 210 of the FIG. 2 flow diagram.

Also included in the integrated circuit design system 104 is an integrated circuit characterization module 132. This module is used to characterize the integrated circuit based on a comparison of the measured apparent resistance determined using the ATE 102 and the static apparent resistance determined by the static IR analyzer 130. Such characterizations may involve, for example, validating the static analysis of the integrated circuit design based on the comparison of the measured and static apparent resistances, or otherwise validating at least a portion of the integrated circuit design. Thus, in the present embodiment, the static analysis performed by static IR analyzer 130 may be validated by confirming that the static apparent resistance is sufficiently close to the measured apparent resistance. Numerous other types of characterizations may be performed based on comparison of the measured and static apparent resistances, including determination of one or more quality measures of the integrated circuit, which may include an indicator of deviation between the measured and static apparent resistances.

In conjunction with a given static analysis validation, quality measure determination, or other characterization, information indicative of the characterization may be provided to a system user. For example, although not expressly illustrated in FIG. 1, a user terminal associated with one or both of the ATE 102 and the design system 104 may be provided and may include a display on which validation or quality measure indicators are presented as part of the characterization of the integrated circuit 110. Numerous other techniques for making information indicative of the characterization apparent to one or more system users or devices may be used.

Like the ATE 102, the integrated circuit design system 104 comprises a processor 140 coupled to a memory 142. Also coupled to the processor 140 is a network interface 144 for permitting the design system to communicate with the ATE 102 or other systems and devices over one or more networks, where the network interface may comprise one or more transceivers. One or both of the static IR analyzer 130 and integrated circuit characterization module 132 may be implemented at least in part in form of software, such as integrated circuit design software 145 stored in memory 142 and executed by processor 140.

The processors 120 and 140 in respective ATE 102 and design system 104 may each comprise a microprocessor, central processing unit (CPU), application-specific integrated circuit (ASIC), field-programmable gate array (FPGA) or other types of processing elements, as well as portions or combinations of such elements.

The memories 122 and 142 in respective ATE 102 and design system 104 may be viewed as examples of what are more generally referred to herein as computer-readable media or other types of computer program products having computer program code embodied therein, and may comprise, for example, electronic memory such as random access memory (RAM) or read-only memory (ROM), magnetic memory, optical memory, or other types of storage devices in any combination.

Although shown in the present embodiment as having separate processor, memory and network interface elements, the ATE 102 and the design system 104 may both be implemented at least in part on a common processing platform comprising one or more processing devices, with each such processing device including a processor coupled to a memory.

As indicated above, it is contemplated that the ATE 102 and the IC design system 104 may communicate with one another over a network. These system elements therefore need not be co-located with one another, and may be configured to communicate with one another over a wide area network such as the Internet. Numerous other types of networks in any combination may be used to support communication between ATE 102 and IC design system 104 via their respective network interfaces 124 and 144.

It should be noted that embodiments of the invention may be implemented in the form of one or more integrated circuits. In a given such integrated circuit implementation, identical die are typically formed in a repeated pattern on a surface of a semiconductor wafer. Each die may include one or more processing devices as described herein, and may include other structures or circuits. The individual die are cut or diced from the wafer, and then each die is packaged as an integrated circuit. One skilled in the art would know how to dice wafers and package die to produce integrated circuits. Integrated circuits so manufactured are considered embodiments of this invention.

The particular configuration of processing system 100 as shown in FIG. 1 is exemplary only, and the processing system 100 in other embodiments may include other elements in addition to or in place of those specifically shown, including one or more elements of a type commonly found in a conventional implementation of such a system. For example, various portions of the ATE 102 and design system 104 may be implemented using alternative arrangements of processor and memory elements, and associated software components or modules, as will be appreciated by those skilled in the art. The terms "ATE" and "integrated circuit design system" as used herein are therefore intended to be broadly construed so as to encompass a wide variety of different processor-based arrangements, including numerous arrangements in which at least portions of each are implemented using one or more processing devices.

Figure 2:
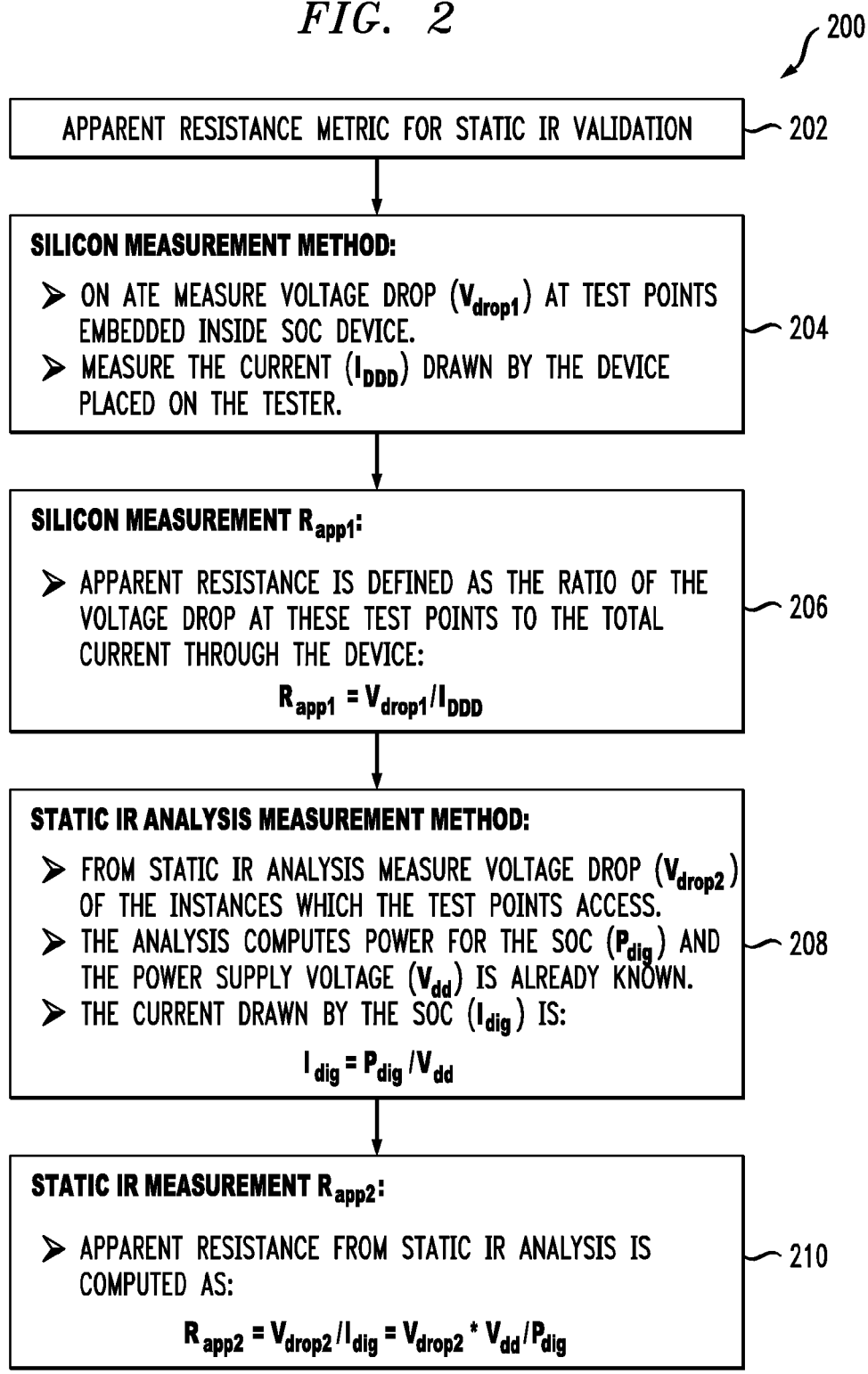
FIG. 2 is a flow diagram illustrating determination of measured and static apparent resistances in the system of FIG. 1.

Referring now to FIG. 2, the flow diagram shown illustrates the manner in which the above-noted measured and static apparent resistances are generated in one embodiment. In this embodiment, the measured and static apparent resistances collectively comprise an apparent resistance metric that is used for static IR validation, as indicated in block 202 of the flow diagram.

It is assumed in this embodiment that the integrated circuit 110 subject to static IR validation is an actual SOC integrated circuit, illustratively implemented in silicon and configured to incorporate multiple embedded test points 112. The SOC integrated circuit is also referred to below as an SOC device. As mentioned previously, blocks 204 and 206 of the flow diagram determine a measured apparent resistance using the ATE 102, and blocks 208 and 210 of the flow diagram determine a static apparent resistance using the static IR analyzer 130 of design system 104.

Blocks 204 and 206 show a silicon measurement method and associated apparent resistance determination, respectively.

Blocks 208 and 210 show a static IR analysis measurement method and associated apparent resistance determination, respectively. Although the term "measurement" is used in the descriptors of these blocks 208 and 210, as in the ATE-based measurement blocks 204 and 206, the measurement in the case of blocks 208 and 210 is based on static analysis, and results in determination of a static apparent resistance, as opposed to the actual measured apparent resistance determined in the case of blocks 204 and 206 using actual measurements performed by the ATE 102 on SOC device 110.

It should be noted that each of blocks 204 and 208 refers to measurement of a corresponding voltage drop generically denoted as $V_{drop}$. These distinct voltage drops may be more particularly referred to herein in the context of the static and measured apparent resistances as $V_{drop1}$ and $V_{drop2}$, respectively.

Similarly, each of blocks 206 and 210 refers to measurement of a corresponding apparent resistance generically denoted as $R_{app}$. These distinct apparent resistances are static and apparent resistances more particularly referred to herein as $R_{app1}$ and $R_{app2}$, respectively, and are determined using the voltage drops $V_{drop1}$ and $V_{drop2}$, respectively. The static and apparent resistances are also referred to herein as respective first and second apparent resistances. As indicated previously, these apparent resistances may be viewed as collectively comprising what is referred to herein as an apparent resistance metric.

In block 204, the SOC device 110 is placed on the load board 108 of the tester 105. A first voltage drop $V_{drop1}$ is measured at the embedded test points 112 within the SOC device 110 using the ATE 102, and a first current $I_{DDD}$ is measured as a total current drawn by the SOC device 110 using the ATE 102.

In block 206, a first apparent resistance $R_{app1}$ is computed as a function of the first voltage drop $V_{drop1}$ and the first current $I_{DDD}$. More particularly, the first apparent resistance is computed as a function of the first voltage drop $V_{drop1}$ and the first current $I_{DDD}$ in accordance with the equation:

$$R_{app1}=V_{drop1}/I_{DDD}.$$

In block 208, static IR analyzer 130 is utilized to measure a second voltage drop $V_{drop2}$ of instances in the integrated circuit design accessed by the embedded test points 112. Also, the static IR analyzer determines a static power $P_{dig}$ for the SOC device design using static analysis, and then computes a second current $I_{dig}$ as a function of the static power $P_{dig}$ and a known supply voltage $V_{dd}$. More particularly, the second current $I_{dig}$ is computed as a function of the static power $P_{dig}$ and the supply voltage $V_{dd}$ in accordance with the equation:

$$I_{dig}=P_{dig}/V_{dd}.$$

In block 210, a second apparent resistance $R_{app2}$ is computed as a function of the second voltage drop $V_{drop2}$ and the second current $I_{dig}$. More particularly, the second apparent resistance is computed as a function of the second voltage drop $V_{drop2}$ and the second current $I_{dig}$ in accordance with the equation:

$$R_{app2}=V_{drop2}/I_{dig}.$$

The two apparent resistances determined in the manner described above are utilized to characterize the SOC device 110. For example, the two apparent resistances $R_{app1}$ and $R_{app2}$ may be compared to determine if they are sufficiently close to one another, and the corresponding static analysis validated or invalidated depending on the result. Alternatively, a quality metric may be generated for the design, such as an indication that the two apparent resistances deviate from one another by an amount less than a specified threshold amount. Numerous other types of characterization of the SOC device 110 as well as its associated design may be made based on comparison of the first and second apparent resistances in the processing system 100.

It is to be appreciated that the particular processing operations shown in the exemplary flow diagram of FIG. 2 are presented by way of illustrative example only, and numerous alternative arrangements of process steps may be used to compute multiple apparent resistances in other embodiments. For example, operations indicated in FIG. 2 as being performed serially may be performed at least in part in parallel with one another in other embodiments. Also, the ordering of the operations may be varied, and certain operations may be combined in other embodiments.

Moreover, in the present embodiment, the silicon measurement blocks 204 and 206 may be repeated for each of multiple chips manufactured in accordance with a given design, while the static measurement blocks 208 and 210 are performed only once for the given design. Thus, for example, the second apparent resistance $R_{app2}$ may be pre-computed or otherwise determined once for the given design and then stored in memory 122 or 142 so as to be retrievable as needed for comparison with values of the first apparent resistance $R_{app1}$ determined for respective chips manufactured in accordance with the given design.

With regard to the test points referred to in FIG. 2, measurements from multiple test points may be averaged or otherwise combined to provide a single value. Thus, for example, multiple first apparent resistances determined using respective test points could be averaged and then compared to a second apparent resistance. As another example, first apparent resistances from each of multiple test points could be compared to a corresponding second apparent resistance. Numerous alternative measurement and comparison operations are possible, utilizing one or more test points. It is therefore to be understood that use of multiple test points is not a requirement of any embodiment of the invention.

In the embodiment of FIG. 2, characterization based on the apparent resistances provides an accurate and efficient technique for correlating actual IR drop measurements with predicted design values, thereby ensuring that the integrated circuit power grid and other components are appropriate for the expected operating conditions, and avoiding situations in which the design is not well matched to the operating conditions. This apparent resistance based approach provides an improved characterization metric that scales well with shrinking device dimensions, and can therefore accommodate integrated circuits with large power densities, low supply voltages and high operating speeds.

The metric in the FIG. 2 embodiment is substantially independent of the specific usage conditions of the SOC device and therefore accurately reflects variations with process and temperature. This enables highly accurate comparison between silicon implementations and corresponding design values in a manner that is independent of the particular ATE environments that are utilized.

Similar results are achieved using other types of apparent resistance measures determined in the manner disclosed herein, such as apparent conductances, as indicated previously. Apparent conductances are considered to be a type of apparent resistance measure as the latter term is broadly used herein.

Again, it should be emphasized that the embodiments of the invention as described herein are intended to be illustrative only. For example, other embodiments of the invention can be implemented using a wide variety of other types of ATE, design system and processing device configurations, apparent resistance measures, apparent resistance determination processes, and integrated circuit characterizations, than those included in the embodiments described herein. These and numerous other alternative embodiments within the scope of the following claims will be readily apparent to those skilled in the art.

What is claimed is:

1. A method comprising:
   determining a first apparent resistance measure for an integrated circuit based on a first voltage drop and a first current that are measured using test equipment;
   determining a second apparent resistance measure for the integrated circuit based on a second voltage drop and a second current that are obtained using static analysis of a corresponding integrated circuit design; and
   characterizing the integrated circuit based on a comparison of the first and second apparent resistance measures;
   wherein determining a second apparent resistance measure comprises:
      determining the second voltage drop using the static analysis;
      determining a static power for the integrated circuit design using the static analysis;
      computing the second current as a function of the static power and a supply voltage;
      computing the second apparent resistance measure as a function of the second voltage drop and the second current; and
   wherein determining the first apparent resistance measure, determining the second apparent resistance measure and characterizing the integrated circuit are performed at least in part by at least one processing device comprising a processor coupled to a memory.

2. The method of claim 1 wherein the first and second apparent resistance measures comprise respective first and second apparent resistances.

3. The method of claim 1 wherein characterizing the integrated circuit comprises validating the static analysis of the integrated circuit design based on the comparison of the first and second apparent resistance measures.

4. The method of claim 1 wherein characterizing the integrated circuit comprises determining a quality measure of the integrated circuit based on the comparison of the first and second apparent resistance measures.

5. The method of claim 2 wherein determining the first apparent resistance comprises:
   measuring the first voltage drop using the test equipment;
   measuring the first current using the test equipment; and
   computing the first apparent resistance as a function of the first voltage drop and the first current.

6. The method of claim 5 wherein measuring the first voltage drop using the test equipment comprises measuring the first voltage drop at one or more embedded test points within the integrated circuit.

7. The method of claim 5 wherein measuring the first current using the test equipment comprises measuring a total current drawn by the integrated circuit.

8. The method of claim 5 wherein computing the first apparent resistance as a function of the first voltage drop and the first current comprises computing the first apparent resistance in accordance with the equation:

$$R_{app1} = V_{drop1}/I_{DDD},$$

where $R_{app1}$ denotes the first apparent resistance, $V_{drop1}$ denotes the first voltage drop, and $I_{DDD}$ denotes the first current.

9. The method of claim 2 wherein determining the second apparent resistance comprises:
computing the second apparent resistance as a function of the second voltage drop and the second current.

10. The method of claim 9 wherein determining the second voltage drop using the static analysis comprises determining the second voltage drop at one or more embedded test points within the integrated circuit design.

11. The method of claim 9 wherein computing the second current as a function of the static power and the supply voltage comprises computing the second current in accordance with the equation:

$$I_{dig} = P_{dig}/V_{dd},$$

where $I_{dig}$ denotes the second current, $P_{dig}$ denotes the static power, and $V_{dd}$ denotes the supply voltage.

12. The method of claim 9 wherein computing the second apparent resistance as a function of the second voltage drop and the second current comprises computing the second apparent resistance in accordance with the equation:

$$R_{app2} = V_{drop2}/I_{dig},$$

where $R_{app2}$ denotes the second apparent resistance, $V_{drop2}$ denotes the second voltage drop, and $I_{dig}$ denotes the second current.

13. A method comprising:
determining a first apparent resistance measure for an integrated circuit based on a first voltage drop and a first current that are measured using test equipment;
determining a second apparent resistance measure for the integrated circuit based on a second voltage drop and a second current that are obtained using static analysis of a corresponding integrated circuit design; and
characterizing the integrated circuit based on a comparison of the first and second apparent resistance measures;
wherein determining a second apparent resistance measure for the integrated circuit comprises retrieving a pre-computed value of the second apparent resistance measure, the pre-computed value being utilizable for comparison with each of multiple values of the first apparent resistance measure determined for respective integrated circuits manufactured in accordance with the integrated circuit design; and
wherein determining the first apparent resistance measure, determining the second apparent resistance measure and characterizing the integrated circuit are performed at least in part by at least one processing device comprising a processor coupled to a memory.

14. A computer program product comprising a non-transitory computer-readable storage medium having computer program code embodied therein, wherein the computer program code when executed by the processing device causes the steps of the method of claim 1 to be performed.

15. An apparatus comprising:
a processor; and
a memory coupled to the processor and configured to store information characterizing a design of an integrated circuit;
wherein the processor is configured to compare a first apparent resistance measure, determined for the integrated circuit based on a first voltage drop and a first current that are measured using test equipment, with a second apparent resistance measure, determined for the integrated circuit based on a second voltage drop and a second current that are obtained using static analysis of the corresponding integrated circuit design, and to characterize the integrated circuit based on the comparison of the first and second apparent resistance measures; and
wherein the processor is further configured to determine the second apparent resistance measure by:
determining the second voltage drop using the static analysis;
determining a static power for the integrated circuit design using the static analysis;
computing the second current as a function of the static power and a supply voltage; and
computing the second apparent resistance measure as a function of the second voltage drop and the second current.

16. The apparatus of claim 15 wherein the first and second apparent resistance measures comprise respective first and second apparent resistances.

17. The apparatus of claim 15 wherein the processor characterizes the integrated circuit by validating the static analysis of the integrated circuit design based on the comparison of the first and second apparent resistance measures.

18. The apparatus of claim 15 wherein the processor characterizes the integrated circuit by determining a quality measure of the integrated circuit based on the comparison of the first and second apparent resistance measures.

19. The apparatus of claim 15 wherein the integrated circuit comprises a system-on-chip integrated circuit, and the first and second voltage drops are associated with one or more embedded test points within the integrated circuit.

20. A processing system comprising:
test equipment adapted for coupling to an integrated circuit; and
a static analyzer configured to perform static analysis on a corresponding design of the integrated circuit;
wherein a first apparent resistance measure is determined for the integrated circuit based on a first voltage drop and a first current that are measured using the test equipment;
wherein a second apparent resistance measure is determined for the integrated circuit based on a second voltage drop and a second current that are obtained using static analysis of the integrated circuit design performed by the static analyzer;
wherein the integrated circuit is characterized based on a comparison of the first and second apparent resistance measures; and
wherein the second apparent resistance measure is determined by:
determining the second voltage drop using the static analysis;
determining a static power for the integrated circuit design using the static analysis;
computing the second current as a function of the static power and a supply voltage; and
computing the second apparent resistance measure as a function of the second voltage drop and the second current.

21. The processing system of claim 20 wherein the static analyzer is part of an integrated circuit design system that is configured to characterize the integrated circuit based on the comparison of the first and second apparent resistance measures.

22. The processing system of claim 20 wherein at least one of the test equipment and the static analyzer comprises a processing device having a processor coupled to a memory.

23. The processing system of claim 20 wherein at least portions of the test equipment and the static analyzer are implemented using a common processing platform comprising one or more processing devices.

24. A method comprising:
   determining a first apparent resistance measure for an integrated circuit based on a first voltage drop and a first current that are measured using test equipment;
   determining a second apparent resistance measure for the integrated circuit based on a second voltage drop and a second current that are obtained using static analysis of a corresponding integrated circuit design; and
   characterizing the integrated circuit based on a comparison of the first and second apparent resistance measures;
   wherein determining the first apparent resistance measure comprises:
      measuring the first voltage drop using the test equipment;
      measuring the first current using the test equipment; and
      computing the first apparent resistance measure as a function of the first voltage drop and the first current; and
   wherein determining the first apparent resistance measure, determining the second apparent resistance measure and characterizing the integrated circuit are performed at least in part by at least one processing device comprising a processor coupled to a memory.

* * * * *